United States Patent [19]
Russell

[11] 3,970,865
[45] July 20, 1976

[54] PSEUDO-COMPLEMENTARY DECODE DRIVER

[75] Inventor: Lewis K. Russell, San Jose, Calif.

[73] Assignee: Signetics Corporation, Sunnyvale, Calif.

[22] Filed: Nov. 11, 1974

[21] Appl. No.: 522,433

Related U.S. Application Data

[63] Continuation of Ser. No. 368,855, June 11, 1973, abandoned.

[52] U.S. Cl. ............................ 307/218; 307/DIG. 5; 307/205
[51] Int. Cl.² ........................................ H03K 19/08
[58] Field of Search ........... 307/205, 218, 251, 238, 307/DIG. 5, 279, 305; 340/42 R, 347

[56] References Cited
UNITED STATES PATENTS

| | | | |
|---|---|---|---|
| 3,526,783 | 9/1970 | Booher | 307/205 |
| 3,653,034 | 3/1972 | Regitz | 307/301 X |
| 3,702,990 | 11/1972 | Ross | 307/238 |

*Primary Examiner*—Stanley D. Miller, Jr.
*Assistant Examiner*—B. P. Davis
*Attorney, Agent, or Firm*—C. Richard Pfeiffer; William H. Dana

[57] ABSTRACT

A decode driver useful in decoders for memory circuits. A plurality of transistors are connected in series between a first reference potential terminal and an output terminal. A second plurality of transistors are connected in parallel between a second reference potential terminal and the output terminal. Each of the transistors receives an input which functions to turn the transistors either on or off. The coding of the inputs determines whether the transistors to which the respective inputs are connected are turned on or off which in turn controls whether or not the output terminal is coupled to the first reference potential terminal or the second reference potential terminal.

9 Claims, 2 Drawing Figures

PSEUDO-COMPLEMENTARY DECODE DRIVER

This is a continuation of application Ser. No. 368,855 filed June 11 1973 now abandoned.

BACKGROUND OF THE INVENTION

This invention pertains to a pseudo-complementary decode driver useful, for example, in driving memory circuits such as MOS memory circuits. Decode drivers are utilized for selectively placing one of a plurality of output terminals at a high or low level in accordance with coded inputs. That is, usually a plurality of decode driver circuits are provided with each one of the decode drivers circuits being associated with a particular one of the plurality of output terminals. Each of the decode driver circuits receives all the inputs and in response to a particular coding of the input is adapted to select (i.e., place at a high potential, for example) an associated output terminal.

Desirable operating characteristics for decode driver circuits are that they be very fast acting circuits and that they consume a minimum of power. In the prior art, decode driver circuits have had what can be referred to as a static pull-up; that is, the output terminal is usually connected to a reference potential terminal through an Mos load resistor, for example. With this configuration a substantial amount of time is required to pull the output terminal up to the potential at the reference potential terminal through the load device. Further, prior art decode drivers have been configured such that there has at all times been a circuit path through load devices between one reference potential terminal and another reference potential terminal, so that the circuit consumes power at all times even when it is not addressed. Prior art decode circuits have also been configured such that there is a multiplicity of gating delays between a set of coded input terminals and the output terminals.

OBJECTS AND SUMMARY OF THE INVENTION

It is an object of this invention to provide a fast, low power consumption decoder circuit.

It is another object of this invention to provide a decode driver having a dynamic pull-up of an output terminal to a reference potential and which consumes power only when addressed.

Briefly, in accordance with one embodiment of the invention a decoder circuit has a plurality of inputs and a plurality of outputs. A decode driver circuit is provided for each one of the plurality of outputs for selectively switching each of the outputs between two levels in response to a unique combination of signals on the plurality of inputs. A first reference potential terminal is provided and a second reference potential terminal. A first plurality of transistors are connected in series with each other to form an AND circuit between the first reference potential terminal and the output terminal. A second plurality of transistors are connected in parallel with each other to form an OR circuit between the output terminal and the second reference potential terminal. Each of the first and second plurality of transistors has one of the plurality of inputs connected thereto for respectively switching each of said transistors on or off.

DESCRIPTION OF THE PREFERRED EMBODIMENTS

Figure 1:
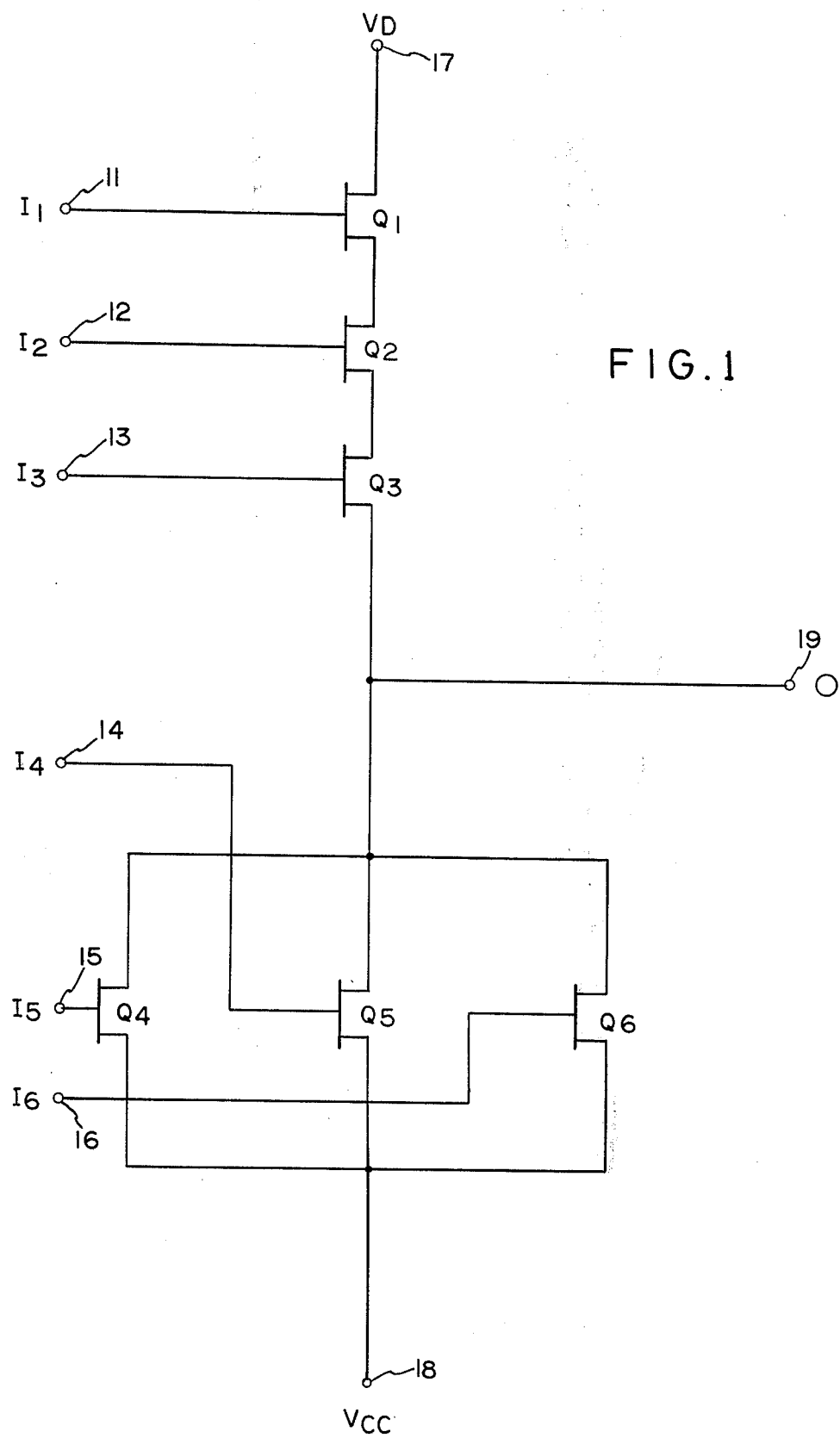
FIG. 1 is a schematic circuit diagram of one decode driver circuit in accordance with this invention which receives six inputs and is responsive to a unique combination of signals on these inputs to select or raise to a high potential the output terminal.

Turning now to FIG. 1 there is shown a schematic circuit diagram of a decode driver circuit in accordance with this invention. A decode driver circuit has a plurality of input terminals which in the particular embodiment shown in FIG. 1 are six in number and are labeled with reference numerals 11 through 16. There are also provided a first reference potential terminal 17 to which a potential source $V_D$ may be applied and a second reference potential terminal 18 to which a different potential source $V_{cc}$ may be applied. There is also provided an output terminal 19. A plurality of transistors, three in this instance, which are labeled Q1, Q2 and Q3, are provided connected in series between the first reference potential terminal 17 and the output terminal 19. In this particular embodiment the transistors Q1, Q2 and Q3 are MOS field effect transistors.

A second plurality of transistors, three in this instance, which are labeled Q4, Q5 and Q6, are connected in parallel with each other between the output terminal 19 and the second reference potential terminal 18. The transistors Q4, Q5 and Q6 are like-wise MOS field effect transistors. Each of the input terminals 11 through 16 is connected to the gate of one of the transistors Q1 through Q6. A plurality of input signals labeled in this instance I1 through I6 are provided to the circuit of FIG. 1 through the input terminals 11 through 16. In accordance with the coding of the inputs i.e, whether they are high or low (or a 1 or 0 in digital terminology) the corresponding transistors Q1 throufh Q6 are either turned on or rendered conducted by a 1 input or are left off or non-conductive by a 0 input.

The three series connected transistors Q1 through Q3 form an AND gate and the three parallel connected transistors Q4 through Q6 form an OR gate. Assume, for example, that the three inputs I1 through I3 are high or represent a digital 1. Then the three transistors Q1 through Q3 are all turned on. Assume also that simultaneously the three inputs I4 through I6 are all low or a digitl 0 so that the parallel connected transistors Q4 through Q6 are off. The first reference potential terminal 17 is, in this instance, connected through the low inpedance on transistors Q1, Q2 and Q3 to the output terminal 19. The output terminal 19 thus goes to $V_D$. The pull-up of the output terminal to $V_D$ is a dynamic pull-up through low impedance on transistors, so that the output terminal $V_D$ is pulled up very rapidly.

A requirement for operation of the decode circuit of FIG. 1 is that at any given moment three of the inputs are on or high (digital 1, for example) and three of the inputs are low or off (digital 0, for example). With this constraint the circuit of FIG. 1 selects the output 19 (i.e., makes it a high output) only when I1, I2 and I3 are high or on, and I4, I5 and I6 are simultaneously low or off. For any other combination of inputs (with the constraint that three of the inputs are high and three of the inputs are low) the output terminal 19 will be connected through one of the parallel connected transistors Q4, Q5 or Q6 to the second reference potential terminal 18 at a potential $V_{cc}$. The circuit of FIG. 1 thus works in a pseudo-complementary fashion even though only one polarity of MOS field effect transistors is used. That is, the circuit is pseudo-complementary in that there is never a direct current path between the two reference potential terminals 17 and 18. Thus to select the output terminal 19 the three transistors Q1, Q2 and Q3 in the AND configuration are turned on and the three parallel connected transistors in the OR configuration are turned off. Output terminal 19 goes to $V_D$. When the output terminal 19 is not selected, decoding of the inputs I1 through I6 is such that any one or any combination of the transistors Q1 through Q3 in the AND configuration are off, and any one or any combination of the three transistors Q4 through Q6 in the OR configuration are on. This connects output terminal 19 to $V_{cc}$.

The advantages of the circuit shown in FIG. 1 are several. First, as mentioned above, it works in a pseudo-complementary fashion even through only one polarity of MOS FET is used in that the two reference potential terminals 17 and 18 are never directly connected. Thus the circuit does not dissipate any power unless it is addressed. This is not the case for prior art decode driver circuits. Additionally, when the output terminal 19 is selected so that inputs I1, I2 and I3 are high, the output terminal 19 is pulled up to $V_D$ at reference potential terminal 17 through the low impedance on transistors Q1, Q2 and Q3. This is a dynamic pull-up rather than a static pull-up through load devices which has been the case with prior art circuits.

The circuit shown in FIG. 1 is illustrated and has been described with reference to six inputs with there being three transistors in and AND arrangement and three transistors in an OR arrangement. Further, a constraint was that of the inputs three must be high at all times and three low, so that three of the transistors are on at one time and three are off. The same considerations apply for embodiments of the invention having fewer or greater than six inputs. That is, there is a corresponding fewer or greter number of transistors connected in an AND arrangement with a corresponding number of transistors connected in an OR arrangement. Thus, with four inputs and a two out of four decode driver circuit there are two transistors connected in an AND arrangement and two transistors connected in an OR arrangement, with the constraint that two of the inputs must be high at all times and two of the inputs must be low at all times. This particular decode driver circuit can be used to select any one of six outputs. With a three out of six arrangement such as shown in FIG. 1 the decode drivers can be used to select any one of twenty outputs. Similar considerations apply to four out of eight, five out of 10, six out of twelve, etc., decode driver circuits. The general consideration is that for N inputs each decode driver circuit has N transistors, with each of the inputs being applied to one of the transistors. N/2 of the transistors are connected in series with each other in an AND arrangement and N/2 of the transistors are connected in parallel with each other in an OR arrangement. The constraint on the input coding is that for all addresses N/2 of the inputs are high and N2 of the inputs are low.

Figure 2:
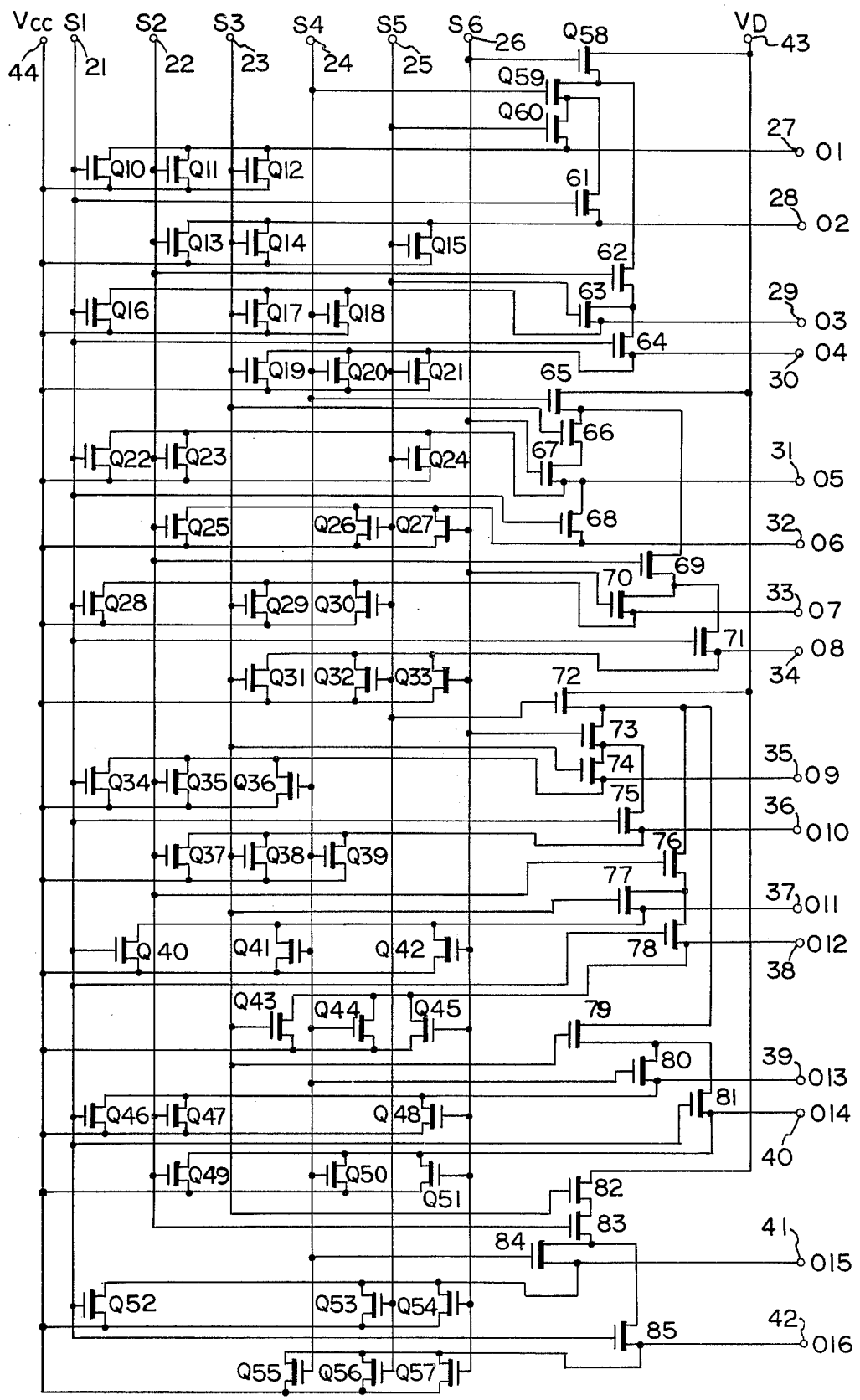
FIG. 2 is a schematic circuit diagram of a decoder circuit utilizing a plurality of decode drivers such as shown in FIG. 1 in which there are six inputs which are decoded to select any one of sixteen outputs.

Turning now to FIG. 2, there is shown a schematic circuit diagram of a decoder utilizing decode driver circuits in accordance with this invention in which there are provided six inputs for selecting any one of 16 outputs. The six inputs, which are labeled S1 through S6, are present at terminals 21 through 26, respectively. The outputs which are labeled 01 through 016 are generated at output terminal 27 through 42, respectively. A first reference potential $V_D$ is provided at a first reference potential terminal 43, and a second reference potential $V_{cc}$ is provided at a second reference potential terminal 44. Three transistors connected in series in an AND arrangement are connected between the first reference potential terminal 43 and the each of the output terminals 27 through 42. Similarly, three transistors are connected in parallel in an OR arrangement between the second reference potential terminal 44 and each of the output terminals 27 through 42.

Thus, in FIG. 2 transistors Q58, Q59 and Q60 are connected in an AND arrangement in series bwtween the first reference potential terminal 43 and output terminal 27. The inputs at terminal 26, 25 and 24 are respectively connected to the transistors Q58, Q59 and Q60. Transistors, Q10, Q11 and Q12 are connected in parallel with each other in an OR arrangement between the second reference potential terminal 44 and the output terminal 27. The inputs at terminals 21, 22 and 23 are respectively coupled to the transistors Q10, Q11 and Q12. Thus, the output O1 at output terminal 27 is connected to the potential $V_d$ at the first reference potential terminal 43 when the inputs S4, S5 and S6 are high or at a digital 1 value and the inputs S1, S2 and S3 are low or at a digitl 0 value.

Similar considerations apply to the remainder of the circuitry shown in FIG. 2 for generating the remainder of the outputs 02 through 016. For each of the outputs there are three series connected transistors connected in an AND arrangement between the terminal 43 and the output, and three parallel connected transistors in an OR arrangement connected between the output and the second reference potential terminal 44. The following table refers to FIG. 2 and lists each of the outputs o1 through o16, lists the state of the inputs S1 through S6 necessary to connect the corresponding output to the first reference potential terminal 43 at which the reference potential $V_D$ is present, and lists the series connected transistors forming an AND gate for each particular output as well as the parallel connected transistors forming an OR gate to that output.

TABLE

| INPUTS $S_1 S_2 S_3 S_4 S_5 S_6$ | AND | OR | OUTPUT |
| --- | --- | --- | --- |
| 0 0 0 1 1 1 | $Q_{58}, Q_{59}, Q_{60}$ | $Q_{10}, Q_{11}, Q_{12}$ | $O_1$ |
| 1 0 0 1 0 1 | $Q_{58}, Q_{59}, Q_{61}$ | $Q_{13}, Q_{14}, Q_{15}$ | $O_2$ |
| 0 1 0 0 1 1 | $Q_{58}, Q_{62}, Q_{63}$ | $Q_{16}, Q_{17}, Q_{18}$ | $O_3$ |
| 1 1 0 0 0 1 | $Q_{58}, Q_{62}, Q_{64}$ | $Q_{19}, Q_{20}, Q_{21}$ | $O_4$ |
| 0 0 1 1 0 1 | $Q_{65}, Q_{66}, Q_{67}$ | $Q_{22}, Q_{23}, Q_{24}$ | $O_5$ |
| 1 0 1 1 0 0 | $Q_{65}, Q_{66}, Q_{68}$ | $Q_{25}, Q_{26}, Q_{27}$ | $O_6$ |
| 0 1 0 1 0 1 | $Q_{65}, Q_{69}, Q_{70}$ | $Q_{28}, Q_{29}, Q_{30}$ | $O_7$ |
| 1 1 0 1 0 0 | $Q_{65}, Q_{69}, Q_{71}$ | $Q_{31}, Q_{32}, Q_{33}$ | $O_8$ |
| 0 0 1 0 1 1 | $Q_{72}, Q_{73}, Q_{74}$ | $Q_{34}, Q_{35}, Q_{36}$ | $O_9$ |
| 1 0 0 1 1 | $Q_{72}, Q_{73}, Q_{75}$ | $Q_{37}, Q_{38}, Q_{39}$ | $O_{10}$ |
| 0 1 1 0 1 0 | $Q_{72}, Q_{76}, Q_{77}$ | $Q_{40}, Q_{41}, Q_{42}$ | $O_{11}$ |
| 1 1 0 0 1 0 | $Q_{72}, Q_{76}, Q_{78}$ | $Q_{43}, Q_{44}, Q_{45}$ | $O_{12}$ |
| 0 0 1 1 1 0 | $Q_{72}, Q_{79}, Q_{80}$ | $Q_{46}, Q_{47}, Q_{48}$ | $O_{13}$ |
| 1 0 1 0 1 0 | $Q_{72}, Q_{79}, Q_{81}$ | $Q_{49}, Q_{50}, Q_{51}$ | $O_{14}$ |
| 0 1 1 1 0 0 | $Q_{82}, Q_{83}, Q_{84}$ | $Q_{52}, Q_{53}, Q_{54}$ | $O_{15}$ |
| 1 1 1 0 0 0 | $Q_{82}, Q_{83}, Q_{85}$ | $Q_{55}, Q_{56}, Q_{57}$ | $O_{16}$ |

Thus, there has been described a pseudo-complementary or push-pull decode driver circuit for use in a decoder for selecting any one of a plurality of outputs in response to a plurality of coded inputs. The decode driver circuit in accordance with this invention is very fast acting in that the outputs are pulled up to a reference potential terminal through low impedance on transistors rather than through any kind of load devices and the decode driver circuit of this invention is a very low power consumption circuit in that it consumes power only when addressed.

I claim:

1. In a decoder circuit having inputs and outputs, a decode driver circuit for forming a plurality of said outputs at output terminals and for selectively coupling each one of the outputs to one of two reference potential levels in response to predetermined coded signal combinations on a plurality of said inputs comprising, first and second reference potential terminals, a first plurality of transistors for forming AND circuits where each AND circuit connects between said first reference potential terminal and a different one of said output terminals, said first plurality including parallel first and second transistors and including a third transistor connected in series with both said first and second transistors, said first and third transistors forming a first one of said AND circuits between said first reference potential terminal and a first one of said output terminals, said second and third transistors forming a second one of said AND circuits between said first reference potential terminal and a second one of said output terminals, a second plurality of transistors connected in parallel to form an OR circuit between said first one of said output terminals and said second reference potential terminal in combination with said first plurality of transistors, a third plurality of transistors connected in parallel to form an OR circuit between said second one of said output terminals and said second reference potential terminal in combination with said first plurality of transistors, said combined transistors of said first, second and third plurality being connectd to be switched on or off by one of said inputs in a predetermined manner providing a decoded output.

2. A decoder circuit formed by transistors where each transistor has a conduction path controlled to be on or off by a gate, said decoder circuit responsive to predetermined coded combinations of inputs, connected to said gates, for selectively coupling each one of a plurality of output terminals to potential levels on first or second reference terminals, comprising, a first transistors having a conduction path; a second transistor having a conduction path connected in series with the conduction path of said first transistor to form a first AND circuit between said first reference terminal and a first one of said output terminals; a third transistor having a conduction path connected in series with said conduction Path of said first transistor to form a second AND circuit between said first reference terminal and a second one of said output terminals, a first plurality of transitors each having a conduction path connected in parallel to form an OR circuit between said first one of said output terminals and said second reference terminal wherein said second transistor and said first plurality are connected in combination at said frist one of said output terminals, a second plurality of transitors each having a conduction path connected in parallel to form an OR circuit between said second one of said output terminals and said second reference terminal, wherein said third transistor and said second plurality are connected in combination at said second one at said output terminals.

3. The decoder circuit of claim 2 wherein said first plurality of transistors includes a fourth transistor and a fifth transistor; wherein said second plurality of transistors includes a sixth transistor and a seventh transistor; wherein said inputs include first, second, third and fourth inputs; wherein said first second and third inputs are connected to the gates of said first, second and third transistors, respectively; wherein said third and fourth inputs are connected to the gates of said fourth and said fifth transistors, respectively; and wherein said second and fourth inputs are connected to the gates of said sixth and seventh transistors, respectively.

4. The decoder circuit of claim 2 including a fourth transistor having a conduction path connected in series with said conduction path of said first transistor whereby said first AND circuit includes said first, said second and said fourth transitors and whereby said second AND circuit includes said first, said third and said fourth transistors.

5. The decoder circuit of claim 4 including, a fifth transistor having a conduction path connected in series with said conduction path of said fourth transistor; a sixth transistor having a conduction path connected in series with the conduction path of said fifth transistor to form a third AND circuit between said first reference terminal and a third one of said outputs, said third AND circuit including said fourth transistor, said fifth transistor and said sixth transistor; a seventh transistor having a conduction path connected in series with said conduction path of said fifth transistor to form a fourth AND circuit between said first reference terminal and a fourth one of said outputs, said fourth AND circuit including said fourth transistor, said fifth transistor and said seventh transistor, a third plurality of transitors each having a conduction path connected in parallel to form an OR circuit between said third one of said outputs and said second reference terminal, a fourth plurality of transistors each having a conduction path connected in parallel to form an OR circuit between said fourth one of said outputs and said second reference terminal.

6. The decoder circuit of claim 5 wherein each of said first, second, third and fourth plurality of transistors forming OR circuits includes three transistors; wherein said inputs include first, second, third, fourth, fifth and sixth inputs; wherein said first, second, third, and fourth inputs connect to the gates of said first, second, third and fourth transistors, respectively; wherein said third, fifth and sixth inputs connect to the gates of said first plurality of transistors; and wherein said second, fifth and sixth inputs connect to the gates of said second plurality of transistors.

7. The decoder circuit of claim 4 wherein said first plurality of transistors includes three transistors; wherein said second plurality of transistors includes three transistors; wherein said inputs include first, second, third, fourth, fifth and sixth inputs; wherein said first, second, third and fourth inputs connect to the gates of said first, second, third, and fourth transistors, respectively; wherein said third, fifth and sixth inputs connect to the gates of said first plurality of transistors; and wherein said second, fifth and sixth inputs connect to the gates of said second plurality of transistors.

8. The decoder circuit of claim 2 in which said transistors comprise field effect transistors.

9. The decoder circuit of claim 8 in which all of said transistors are MOS field effect transistors of the same polarity.

* * * * *